United States Patent
Oyaizu et al.

(10) Patent No.: US 8,403,536 B2
(45) Date of Patent: Mar. 26, 2013

(54) LIGHT-EMITTING MODULE AND ILLUMINATING APPARATUS HAVING AN INSULATING BASE HAVING A PLURALITY OF INSULATING LAYERS

(75) Inventors: Tsuyoshi Oyaizu, Yokohama (JP); Seiko Kawashima, Yokosuka (JP); Haruki Takei, Kawasaki (JP); Naoko Matsui, Izumisano (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 614 days.

(21) Appl. No.: 12/606,211

(22) Filed: Oct. 27, 2009

(65) Prior Publication Data

US 2010/0103680 A1  Apr. 29, 2010

(30) Foreign Application Priority Data

Oct. 28, 2008  (JP) ................................. 2008-276915
Sep. 25, 2009  (JP) ................................. 2009-221147

(51) Int. Cl.
  *F21V 29/00* (2006.01)
  *F21V 21/00* (2006.01)
  *H05B 33/04* (2006.01)
  *F21V 7/20* (2006.01)

(52) U.S. Cl. ..... 362/294; 313/46; 313/512; 362/296.02; 362/382

(58) Field of Classification Search ................... 313/46, 313/512; 362/294, 296.02, 382
See application file for complete search history.

(56) References Cited

U.S. PATENT DOCUMENTS

| 6,233,817 | B1 | 5/2001 | Ellis |
| 2003/0193055 | A1* | 10/2003 | Martter et al. ................... 257/79 |
| 2003/0202314 | A1 | 10/2003 | Appelt |
| 2006/0012991 | A1 | 1/2006 | Weaver |
| 2006/0160409 | A1 | 7/2006 | Shimizu |
| 2007/0102710 | A1 | 5/2007 | Martter |
| 2007/0165402 | A1 | 7/2007 | Weaver |
| 2007/0257274 | A1 | 11/2007 | Martter |
| 2009/0015168 | A1* | 1/2009 | Layer et al. ................. 315/169.3 |

FOREIGN PATENT DOCUMENTS

| EP | 1020909 | 7/2000 |
| JP | 01-139250 | 5/1989 |
| JP | 01-232795 | 9/1989 |
| JP | 05-075225 | 3/1993 |
| JP | 2006-261600 | 9/2006 |
| JP | 2006-270002 | 10/2006 |

(Continued)

OTHER PUBLICATIONS

English language abstract of JP-2006-344690.

(Continued)

*Primary Examiner* — Nimeshkumar Patel
*Assistant Examiner* — Steven Horikoshi
(74) *Attorney, Agent, or Firm* — DLA Piper LLP (US)

(57) ABSTRACT

A light-emitting module includes a substrate, a wiring pattern, and a light-emitting device that generates heat. The substrate includes a metal base and an insulating base that is stacked on the metal base and has a mount surface on the opposite side of the metal base. The insulating base has a plurality of insulating layers stacked on one another. The wiring pattern is provided on the mount surface of the substrate. The light-emitting device is mounted on the mount surface of the substrate and is electrically connected to the wiring pattern.

5 Claims, 3 Drawing Sheets

FOREIGN PATENT DOCUMENTS

| | | |
|---|---|---|
| JP | 2006-344690 | 12/2006 |
| JP | 2007-214249 | 8/2007 |
| JP | 2007-300138 | 11/2007 |
| WO | WO 2006/019730 | 2/2006 |
| WO | WO 2006097225 A1 * | 9/2006 |

OTHER PUBLICATIONS

Machine English language translation of JP-2006-344690.
European Search Report issued in EP 09013540 on Jul. 25, 2011.
Japanese Office Action issued in JP 2009-221147, mailed Jun. 1, 2010.
English language translation of Japanese Office Action issued in JP 2009-221147, mailed Jun. 1, 2010.
English language abstract of JP 2006-270002, published Oct. 5, 2006.
Machine English language translation of JP 2006-270002, published Oct. 5, 2006.
English language abstract of JP 2006-261600, published Sep. 28, 2006.
Machine English language translation of JP 2006-261600, published Sep. 28, 2006.
English language abstract of JP 2007-300138, published Nov. 15, 2007.
Machine English language translation of JP 2007-300138, published Nov. 15, 2007.
English language abstract of JP 05-075225, published Mar. 26, 1993.
Machine English language translation of JP 05-075225, published Mar. 26, 1993.
English language abstract of JP 01-232795, published Sep. 18, 1989.
English language abstract of JP 01-139250, published May 31, 1989.
English language abstract of JP 2007-214249, published Aug. 23, 2007.
Machine English language translation of JP 2007-214249, published Aug. 23, 2007.

* cited by examiner

LIGHT-EMITTING MODULE AND ILLUMINATING APPARATUS HAVING AN INSULATING BASE HAVING A PLURALITY OF INSULATING LAYERS

CROSS-REFERENCE TO RELATED APPLICATIONS

This application is based upon and claims the benefit of priority from prior Japanese Patent Applications No. 2008-276915, filed Oct. 28, 2008; and No. 2009-221147, filed Sep. 25, 2009, the entire contents of both of which are incorporated herein by reference.

BACKGROUND OF THE INVENTION

1. Field of the Invention

The present invention relates to a light-emitting module including a substrate on which a light-emitting device that causes heat generation during lighting such as a light-emitting diode is mounted, and an illuminating apparatus that uses the light-emitting module as a light source.

2. Description of the Related Art

Recently, as a light source for general illumination purpose, a light-emitting module including a plurality of light-emitting devices such as light-emitting diodes have been used. A light-emitting module disclosed in Japanese Patent KOKAI Publication No. 2006-344690 comprises an enamel substrate, on which a plurality of light-emitting devices are mounted. The enamel substrate includes a metal core and an enamel layer that coats the surface of the metal core. The enamel layer is an example of an insulating layer and is formed by baking glass powder, for example, on the surface of the metal core.

The enamel substrate comprises a mount surface and a back surface that is located on the opposite side of the mount surface. A plurality of reflecting cups are formed on the mount surface. The reflecting cups and the mount surface are continuously covered with the enamel layer. A light-emitting device is mounted inside each of the reflecting cups. On the back surface of the enamel substrate, the metal core is exposed outside the enamel substrate after the enamel layer is removed. Thereby, the back surface of the enamel substrate also functions as a heat dissipater.

According to the conventional light-emitting module disclosed in the above-described Japanese Patent KOKAI Publication, dielectric strength between electrical components such as the light-emitting devices and the metal core is secured by the enamel layer. Further, heat gene'rated by the light-emitting device upon lighting of the light-emitting device is transferred from the enamel layer to the metal core. The heat of the light-emitting device transferred to the metal core is dissipated into the outside of the light-emitting module from the heat dissipater of the enamel substrate. It is thereby possible to attain excellent heat dissipation of the light-emitting device, and suppress increase in temperature of the light-emitting device.

The conventional light-emitting module uses only the single enamel layer so as to secure dielectric strength between electrical components such as the light-emitting devices and the metal core. In the process of manufacturing insulating layers such as enamel layers, defects inevitably occur that would deteriorate dielectric strength. In order to obtain a desired dielectric strength when the insulating layer is a single layer, it is necessary to increase thickness of the insulating layer based on the prediction that defects may occur in the insulating layer.

More specifically, the defects that would deteriorate dielectric strength denote voids generated in insulating layers or foreign bodies involved in insulating layers. A defective portion in an insulating layer is no different from a locally thin portion of the insulating layer, and dielectric strength of the defective portion decreases. It is therefore necessary to increase thickness of the insulating layer to compensate for decrease in dielectric strength when the insulating layer is a single layer.

Increase in thickness of the insulating layer, however, inevitably causes increase in thermal resistance of the insulating layer. This interferes with heat transfer from the light-emitting device to the metal core, and results in decrease in heat dissipation of the light-emitting device.

In conventional light-emitting modules, in order to effectively obtain light emitted by light-emitting devices, a single insulating layer is sometimes mixed with white pigments so as to attain improved light reflectivity of the insulating layer.

White pigments, however, are same as foreign bodies to the insulating layer. Accordingly, the insulating layer containing white pigments need to secure a desired dielectric strength by further increasing its thickness. This results in further increase in thermal resistance of the insulating layer and deterioration in heat transfer from the light-emitting device to the metal core.

BRIEF SUMMARY OF THE INVENTION

An object of the present invention is to obtain a light-emitting module capable of improving heat dissipation properties of a light-emitting device while securing dielectric strength.

Another object of the present invention is to obtain an illuminating apparatus having a light-emitting module capable of obtaining a sufficient quantity of light while securing dielectric strength.

In order to achieve the above-described object, a light-emitting module according to a first aspect of the present invention comprises: a substrate including a metal base and an insulating base that is stacked on the metal base and has a mount surface on the opposite side of the metal base, the insulating base having a plurality of insulating layers stacked on one other; a wiring pattern provided on the mount surface of the substrate; and a light-emitting device mounted on the mount surface of the substrate, the light-emitting device being electrically connected to the wiring pattern, and generating heat upon energization.

According to the first aspect of the present invention, at least one light-emitting device is mounted on a mount surface of a substrate that includes a wiring pattern. The light-emitting device is electrically connected to the wiring pattern.

According to the first aspect of the present invention, the wiring pattern may be formed by plating or printing, or may be formed by affixing a conductive plate to the mount surface. The wiring pattern and the light-emitting device may be connected directly through flip chip bonding, or may be connected indirectly through a wire bonding that uses a bonding wire.

According to the first aspect of the present invention, a metal base forming the substrate can be formed of a metal excellent in thermal conductivity, such as aluminum, stainless steel, copper, and alloys thereof. A plurality of insulating layers forming an insulating base may be formed of a synthetic resinous material having electric insulation properties, such as glass epoxy resin, or can be formed of an inorganic material such as glass and ceramics. Further, a light-emitting diode, which is an example of a semiconductor light-emitting device, should be desirably used as the light-emitting device.

According to the first aspect of the present invention, thickness of the insulating layers should be preferably between 5 µm-30 µm. When thickness of the insulating layers is less than 5 µm, the size of defects such as voids generated in the process of forming the insulating layers is too large, compared to the thickness of the insulating layers. This raises the possibility of making it difficult to form the insulating layers.

When the thickness of the insulating layers exceeds 30 µm, on the other hand, the number of insulating layers needed to be stacked to obtain an insulating base with a desired thickness decreases. As a result, when defects such as voids are included in each of a plurality of insulating layers stacked on one another, the probability that the defects in the insulating layer match the thickness direction of the insulating base increases as the number of stacked insulating layers decreases.

Accordingly, the area where defects match the insulating base is apparently no different from an area where thickness of the insulating base is locally thin. This makes it difficult to secure dielectric strength.

According to the first aspect of the present invention, an insulating base of a substrate on which a light-emitting device is mounted includes a plurality of insulating layers stacked on one another. In other words, the insulating base has a multi-layered structure, instead of a single-layered structure. It is therefore possible to reduce the probability that even if defects such as voids may be included in insulating layers, defects in adjacent insulating layers match along the thickness direction of the insulating base. That is, when the insulating base is viewed as a whole, defects included in the insulating layers are apt to scatter in the direction crossing the direction in which the insulating layers are stacked.

Accordingly, an insulating base including a plurality of insulating layers stacked on one another can easily secure a desired dielectric strength between a light-emitting device and a metal base of a substrate. Thereby, thickness of the insulating base including a plurality of insulating layers stacked on one another can be decreased as compared to a single-layered insulating base, on the assumption that desired dielectric strengths are equal. By decreasing thickness of the insulating base, thermal resistance peculiar to the insulating base decreases, and heat generated by the light-emitting device can be effectively transferred to the metal base.

According to a second aspect of the present invention, a material having light reflectivity is blended into one of a plurality of insulating layers that is located on the opposite side of the metal base.

In the second aspect of the present invention, a powder such as titanium oxide and barium sulfide, which are examples of white pigments, can be used as the material having light reflectivity. It is to be noted that any other materials having high light reflectivity, as well as white pigments, may be used as the material having light reflectivity.

According to the second aspect of the present invention, an insulating layer located on the opposite side of the metal base has light reflectivity. Thereby, a portion of light emitted by the light-emitting device can be reflected in a direction in which light should be radiated using the single insulating layer.

Materials having high light reflectivity inevitably involve thermal resistance. According to the second aspect of the present invention, the material having light reflectivity is not blended into all the insulating layers, but is blended only into the single insulating layer located on the opposite side of the metal base. Accordingly, even if the material having light reflectivity is blended into the insulating base, it is possible to suppress increase in thermal resistance of the insulating base. It is thereby possible to effectively transfer heat of the light-emitting device from the insulating base to the metal base.

According to a third aspect of the present invention, each of a plurality of insulating layers includes voids having a size smaller than the thickness of the insulating layers.

According to the third aspect of the present invention, voids are trapped in the insulating layers, or are mere hollows that open to the surface of the insulating layers. Therefore, the voids do not prevent the insulating layers from being formed, and the insulating layers can be reliably obtained with a desired thickness.

According to a fourth aspect of the present invention, a metal base has a heat dissipater which dissipates heat of the light-emitting device. The heat dissipater is located on the opposite side of the insulating base.

According to the fourth aspect of the present invention, the light-emitting device causes heat generation upon energization. The heat generated by the light-emitting device is transferred to the metal base via the insulating base from the light-emitting device. The heat transferred to the metal base is dissipated to the opposite side of the light-emitting device from the heat dissipater. Accordingly, the metal base also functions as a heatsink thermally connected to the light-emitting device, and increase in temperature of the light-emitting device can be suppressed.

In order to achieve the above-described object, an illuminating apparatus according to a fifth aspect of the present invention comprises: a light-emitting module of one of the first to fourth aspects; and a lighting apparatus configured to light a light-emitting device of the light-emitting module.

According to the fifth aspect of the present invention, dielectric strength between the light-emitting device and the metal base of the substrate can be easily secured, and thickness of the insulating base can be decreased. Thereby, thermal resistance peculiar to the insulating base decreases, and the heat generated by the light-emitting device can be effectively transferred to the metal base.

According to the light-emitting module of the present invention, the insulating base of the substrate can be made thin while securing dielectric strength, and thereby thermal resistance peculiar to the insulating base can be reduced. Accordingly, heat generated by the light-emitting device can be effectively transferred to the metal base, and thereby heat dissipation of the light-emitting device is improved, and a sufficient quantity of light is obtained.

According to the illuminating apparatus of the present invention, thermal resistance peculiar to the insulating base included in the light-emitting module can be reduced, and heat generated by the light-emitting device can be effectively dissipated from the metal base. Accordingly, heat dissipation properties of the light-emitting device are improved, and a sufficient quantity of light can be secured for illumination purpose.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL
VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Hereinafter, an embodiment of the present invention will be described with reference to FIG. 1 to FIG. 5.

Figure 1:
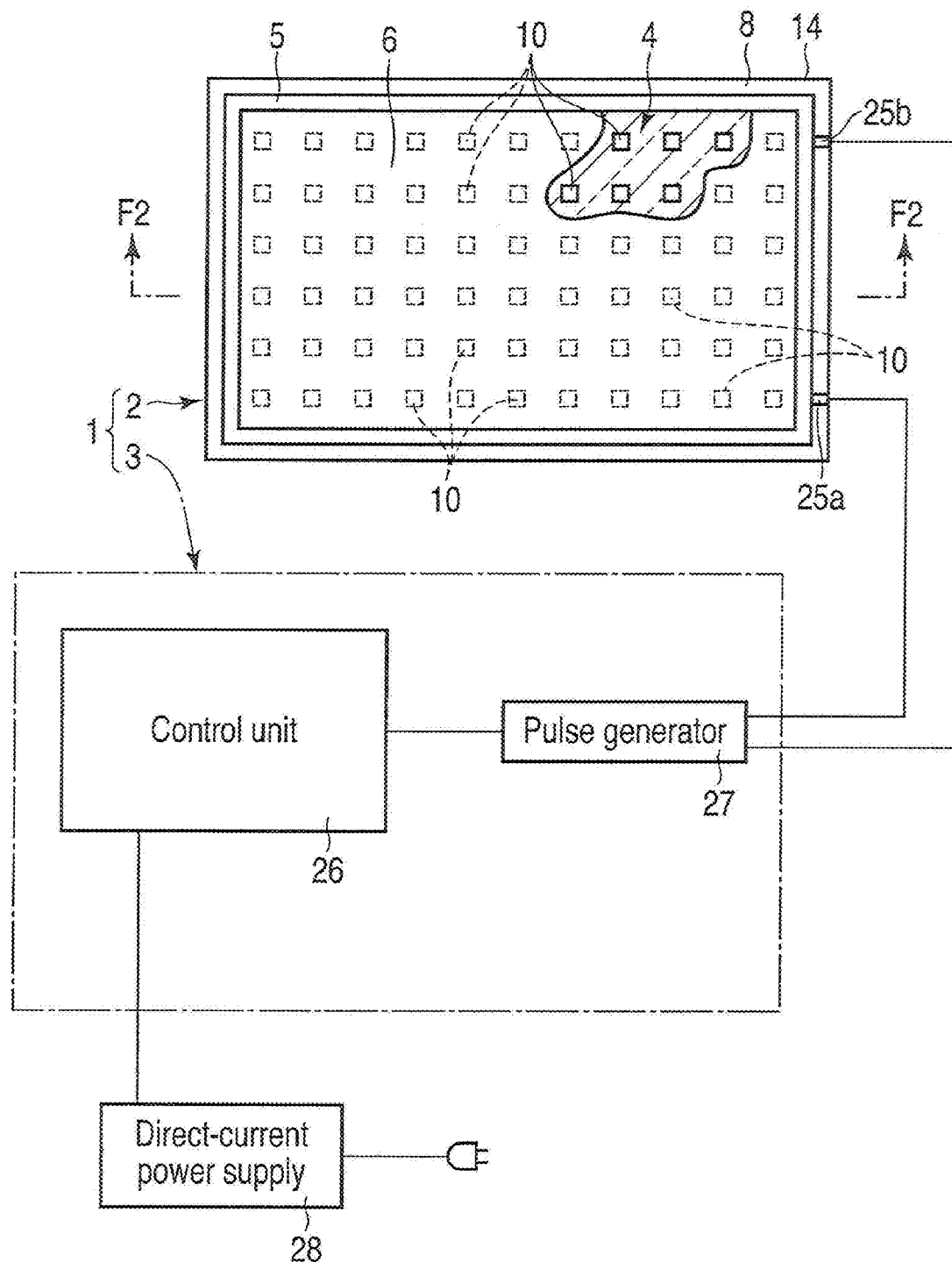
FIG. 1 is a plan view schematically illustrating an illuminating apparatus according to an embodiment of the present invention.

FIG. 1 discloses a illuminating apparatus 1 used in the field of general illumination. The illuminating apparatus 1 is formed of a chip-on-board (COB) type light-emitting module 2 and a lighting apparatus 3, for example.

Figure 2:
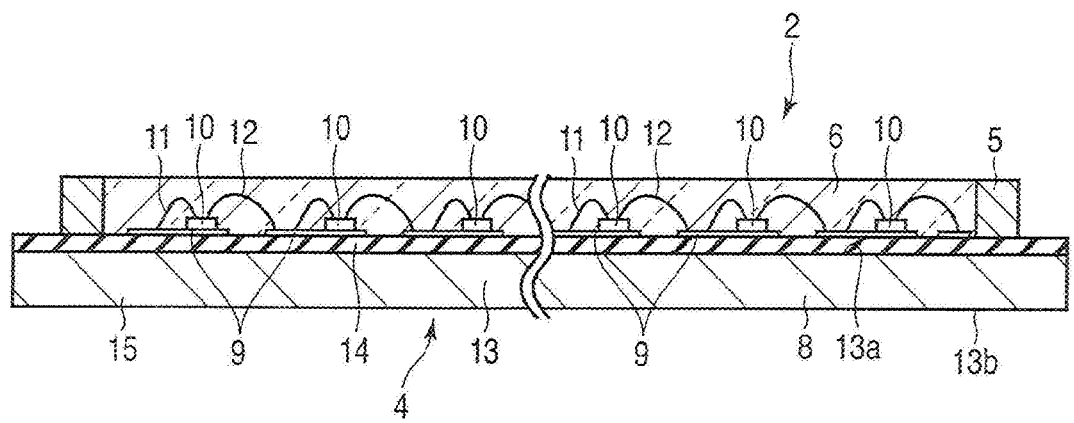
FIG. 2 is a cross-sectional view along the line F2-F2 of FIG. 1.

The light-emitting module 2 includes a printed circuit board 4, a frame 5, and a sealing member 6. The printed circuit board 4 has a substrate 8, wiring patterns 9, light-emitting diodes 10, and bonding wires 11 and 12, as shown in FIG. 2.

The substrate 8 has a square shape, for example. The substrate 8 includes a base 13 and an insulating base 14. The base 13 is formed of a metal material such as stainless steel, and has heat conductivity. The base 13 has a flat first surface 13a and a second surface 13b that is located on the opposite side of the first surface 13a. The second surface 13b functions as a heat dissipater 15 exposed to the outside of the base 13 at the backside of the base 13.

The printed circuit board 4 of the present embodiment is provided in a metal main body, not shown, included in the illuminating apparatus 1, such that the printed circuit board 4 closely contacts the heat dissipater 15 of the base 13. This enables heat dissipation from the printed circuit board 4 to the main body of the apparatus.

The heat dissipater 15 of the base 13 does not particularly need to closely contact the main body of the apparatus. For example, the heat dissipater 15 may be exposed to the outside of the main body of the apparatus, such that heat generated by the printed circuit board 4 is directly dissipated into the atmosphere. In this case, it is preferable to form a plurality of fins in the heat dissipater 15, or provide an uneven surface in the heat dissipater 15, for example, so as to sufficiently secure an area for heat dissipation in the heat dissipater 15.

Figure 3:
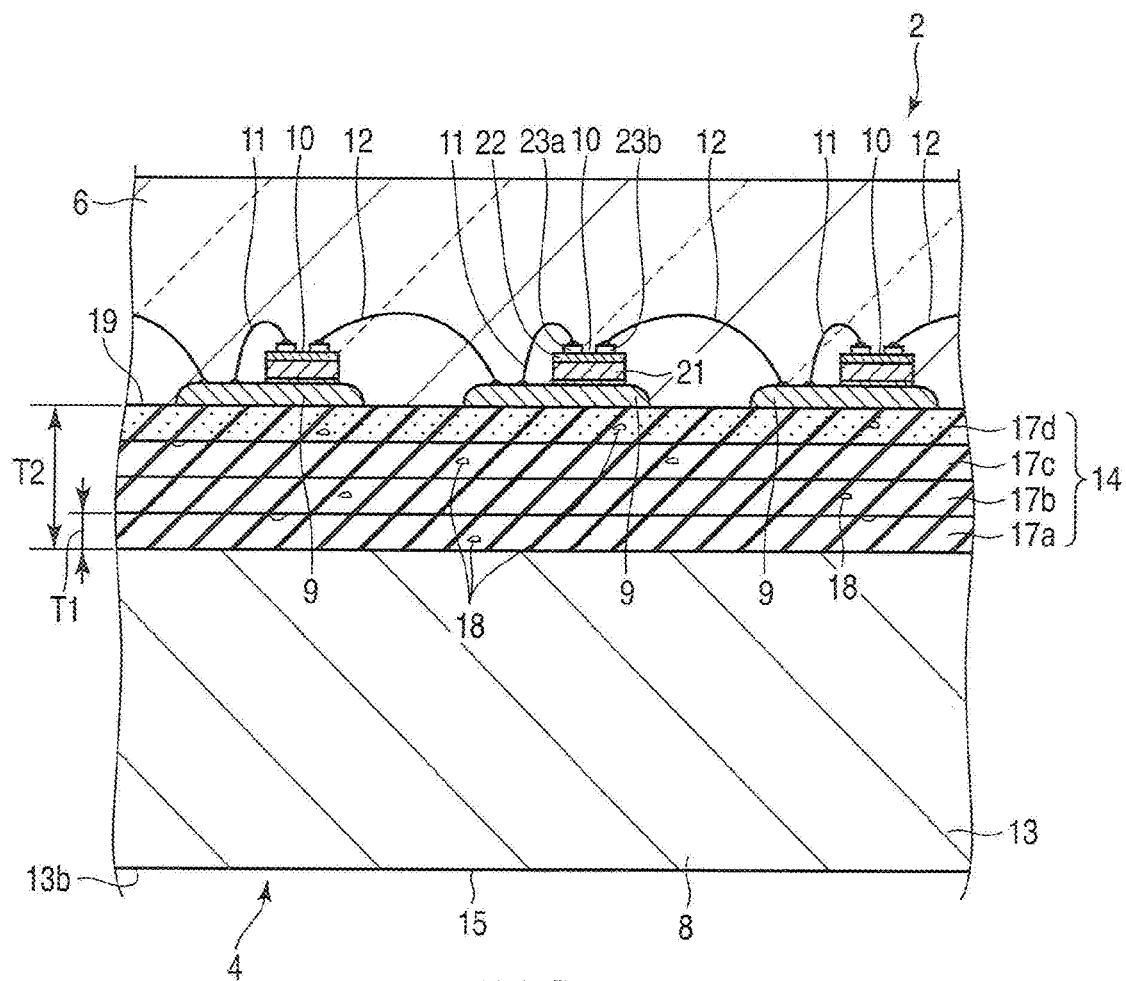
FIG. 3 is a cross-sectional view of a light-emitting module included in the illuminating apparatus of FIG. 1.

As shown in FIG. 3, the insulating base 14 is formed by stacking four insulating layers 17a, 17b, 17c and 17d, for example, on one other in a thickness direction of the substrate 8. According to the present embodiment, each of the insulating layers 17a, 17b, 17c and 17d has a thickness of 15 μm, for example. The insulating base 14 should be desirably equal to or more than 0.8 mm in thickness, assuming that the strength is 2 kg. The number of the insulating layers 17a, 17b, 17c and 17d is determined by the thickness of the insulating base 14.

The insulating layers 17a, 17b, 17c and 17d are formed by coating the substrate with paste-form glass frit through screen printing, for example. More specifically, the insulating layer 17a, the first layer to be stacked on the first surface 13a of the base 13, is formed by coating the first surface 13a with paste-form glass frit, and then sintering the glass frit. The insulating layer 17b, the second layer, is formed by coating the first insulating layer 17a with paste-form glass frit, and then sintering the glass frit. The third and fourth layers, the insulating layer 17c and the insulating layer 17d, respectively, are formed by repeating the procedure of forming the second insulating layer 17b.

Since each of the four insulating layers 17a, 17b, 17c and 17d is obtained by coating the substrate with paste-form glass frit, air bubbles are inevitably trapped in the glass frit during the coating. The trapped air bubbles ascend in the glass frit and exit from the glass frit during the process of sintering the glass frit.

However, not all the air bubbles completely exit from the glass frit; some of the air bubbles do not completely exit from the glass frit, and remain as a plurality of minute voids 18 in the glass frit.

Figure 4:
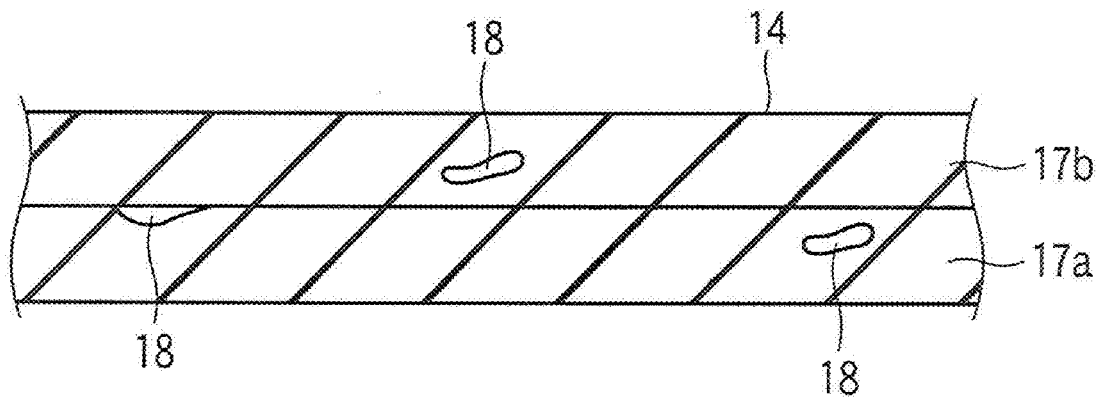
FIG. 4 is a cross-sectional view of an insulating base schematically illustrating the positional relationship between a plurality of insulating layers stacked on one another and voids included in the insulating layers according to an embodiment of the present invention.

FIG. 4 represents a state of voids 18 remaining in the two insulating layers 17a and 17b stacked on each other. The voids 18 have a size smaller than the thickness of each of the insulating layers 17a and 17b. In other words, the size of the voids 18 is smaller than the value:

$$T2 \times 1/N,$$

where T2 is the thickness of the insulating base 14, and N is the number of insulating layers 17a, 17b, 17c and 17d stacked on one another.

Accordingly, the voids 18 are trapped in the insulating layers 17a and 17b, or mere hollows that open in the surface of the insulating layers 17a, 17b, 17c and 17d. That is, when the air bubbles trapped in the glass frit do not completely exit in the process of firing the glass frit, the probability increases that the air bubbles remain in the surface of the insulating layers 17a, 17b, 17c and 17d as hollows.

As shown in FIG. 3, the insulating layer 17d, the fourth layer that is farthest from the base 13, forms a mount surface 19 of the insulating base 14. The mount surface 19 is flat, and located on the opposite side of the heat dissipater 15 of the base 13.

According to the present embodiment, of the insulating layers 17a, 17b, 17c and 17d, only the insulating layer 17d, the fourth layer, is white. Therefore, the fourth insulating layer 17d has light reflectivity. In order to provide the fourth insulating layer 17d with light reflectivity, paste-form glass frit blended with 30 wt % of white powder, such as titanium oxide, is used as a material forming the insulating layer 17d.

In the present embodiment, the four insulating layers 17a, 17b, 17c and 17d are formed by coating the substrate with paste-form glass frit through screen printing; however, the present invention is not limited thereto. For example, the four insulating layers 17a, 17b, 17c and 17d may be formed by burning on the paste-form glass frit.

As shown in FIG. 3, the wiring patterns 9 are arranged in a matrix on the mount surface 19 of the insulating base 14. The wiring pattern 9 of the present embodiment is formed of a printed layer, for example. A paste-form ink including conductive material particles blended into metal powder, which will be a main ingredient, is used as the printed layer. The printed layer is obtained by printing the ink with desired patterning on the fourth insulating layer 17d through screen printing, for example, and then firing the ink to harden it.

The light-emitting diode 10 is an example of a light-emitting device and a heating element. In the present embodiment, a chip-form semiconductor light-emitting device that emits blue light with the wavelength of 460 nm, for example, is used as the light-emitting diode 10. As shown in FIG. 3, the light-emitting diode 10 has a base 21 and a semiconductor light-emitting layer 22. The base 21 is formed of sapphire, for example, having electric insulation properties. The semiconductor light-emitting layer 22 is stacked on the base 21. Furthermore, a pair of electrodes 23a and 23b is arranged on the semiconductor light-emitting layer 22.

The base 21 of the light-emitting diode 10 is adhered to a top surface of each of the wiring patterns 9 using an adhesive 24 having translucency, such as transparent silicone resin. The light-emitting diode 10 is biased toward an end of the wiring pattern 9 with respect to the center of the wiring pattern 9.

As shown in FIG. 3, one of the electrodes 23a of the light-emitting diode 10 is electrically connected to the other end of the wiring pattern 9, to which the light-emitting diode 10 is bonded via a bonding wire 11. The other electrode 23b of the light-emitting diode 10 is electrically connected to the other end of another wiring pattern 9 that is adjacent to the light-emitting diode 10 via a bonding wire 12. Thin metallic wires such as gold wires or aluminum wires should be preferably used as the bonding wires 11 and 12.

The wiring patterns 9 and the bonding wires 11 and 12 form a series circuit in cooperation with each other. The series circuit connects the light-emitting diodes 10 in series. One end of the series circuit is electrically connected to a first terminal 25a. The other end of the series circuit is electrically connected to a second terminal 25b. As shown in FIG. 1, the first terminal 25a and second terminal 25b are arranged at intervals along an outer periphery of the mount surface 19 of the insulating base 14.

Furthermore, according to the present embodiment, the first and second terminals 25a and 25b are formed on the mount surface 19 together with wiring patterns 9 by screen-printing a conductive ink on the mount surface 19.

As shown in FIG. 1, the frame 5 has the shape of a square frame slightly smaller than the substrate 8. The frame 5 is mounted on the mount surface 19 so as to surround all the light-emitting diodes 10 on the mount surface 19. The first and second terminals 25a and 25b connected to the series circuit is located outside of the frame 5.

As shown in FIGS. 2 and 3, the sealing member 6 is charged into a region surrounded by the frame 5. The sealing member 6 is solidified while covering the light-emitting diodes 10, the wiring patterns 9, and the bonding wires 11 and 12. The sealing member 6 is formed of a transparent silicone resin, which is an example of a translucent material. Yellow phosphor particles, for example, are blended into the sealing member 6. The phosphor particles are approximately uniformly dispersed inside the sealing member 6 as a preferable example. Accordingly, the sealing member 6 also functions as a phosphor layer.

The color of the phosphor particles blended into the sealing member 6 is not limited to yellow. In order to improve color rendering properties of the light emitted by the light-emitting diode 10, red phosphor particles that are excited by blue light and emit red light or green phosphor particles that emit green light may be blended as needed.

As shown in FIG. 1, the lighting apparatus 3 includes a control unit 26 and a pulse generator 27. An output end of the pulse generator 27 is electrically connected to the first and second terminals 25a and 25b. The control unit 26 controls the timing, widths, and heights of pulses generated by the pulse generator 27. Furthermore, the control unit 26 is connected to a direct-current power supply 28.

When the light-emitting module 2 is lighted by the lighting apparatus 3 in the illuminating apparatus 1 with the above-described configuration, illumination is performed as follows. That is, a voltage is applied to the light-emitting diodes 10 via the series circuit, and the light-emitting diodes 10 are lighted. The light-emitting diodes 10 emit light having wavelengths mainly of blue light. The blue light is made incident on the transparent sealing member 6. A portion of the blue light that has been made incident on the sealing member 6 strikes the yellow phosphor particles dispersed in the sealing member 6, and is absorbed to the yellow phosphor particles. The remaining blue light penetrates the sealing member 6 without striking the yellow phosphor particles, and is emitted to the outside of the light-emitting module 2.

The yellow phosphor particles that have absorbed the blue light are excited, and emit light of a color different from blue. More specifically, the yellow phosphor particles mainly emit yellow light. The yellow light penetrates the sealing member 6, and is radiated outside the light-emitting module 2. As a result, the yellow light and the blue light are mixed together into white color light, which is made available for illumination purpose.

The light emitted toward the substrate 8 by the light-emitting diode 10 reaches the fourth insulating layer 17d forming the mount surface 19. The fourth insulating layer 17d blended with white powder has light reflectivity. Therefore, the light that has reached the fourth insulating layer 17d is reflected toward the outside of the light-emitting module 2. It is thereby possible to effectively obtain light emitted by the light-emitting diode 10.

The light-emitting diode 10 causes heat generation when lighted. The heat generated by the light-emitting diode 10 is transferred to the metal base 13 mainly via the wiring pattern 9 and the insulating base 14. The heat transferred to the base 13 is dissipated to the outside of the light-emitting module 2 by the heat dissipater 15 that is located at the backside of the base 13.

According to the embodiment of the present invention, the printed circuit board 4 forming the light-emitting module 2 has the insulating base 14 that includes a plurality of light-emitting diodes 10 mounted thereon. The insulating base 14 adopts a multi-layered structure in which four insulating layers 17a, 17b, 17c and 17d are stacked on one another, instead of a single-layered structure.

Therefore, in the process of stacking the insulating layers 17a, 17b, 17c and 17d one by one, even if the voids 18 are generated or minute foreign matters in the air are trapped in the insulating layers 17a, 17b, 17c and 17d, it is possible to secure a desired dielectric strength between the light-emitting diodes 10 and the base 13 while decreasing the thickness of the insulating layers 17a, 17b, 17c and 17d.

More specifically, even if defects such as voids 18 are included in the insulating layers 17a, 17b, 17c and 17d, it is possible to reduce the probability that defects in adjacent ones of the insulating layers 17a, 17b, 17c and 17d match the thickness direction of the insulating base 14 by stacking the insulating layers 17a, 17b, 17c and 17d on one another.

In other words, when the insulating base 14 is viewed as a whole, the defects included in the insulating layers 17a, 17b, 17c and 17d are easily dispersed in a direction that the defects spread along the mount surface 19 of the insulating base 14.

Accordingly, the insulating base 14 including the four insulating layers 17a, 17b, 17c and 17d stacked on one another can easily secure a desired dielectric strength between the light-emitting devices 10 and the base 13 of the substrate 8, in comparison with a single-layered insulating base. As a result, the insulating base 14 including the four insulating layers 17a, 17b, 17c and 17d stacked on one another can be made thinner than a single-layered insulating base, assuming that the dielectric strength to be obtained is constant.

Furthermore, if the thickness of the insulating layers 17a, 17b, 17c and 17d is small, air bubbles trapped in glass frit, which will be the insulating layers 17a, 17b, 17c and 17d, easily exit from the glass frit in the process of burning the glass frit.

Figure 5:
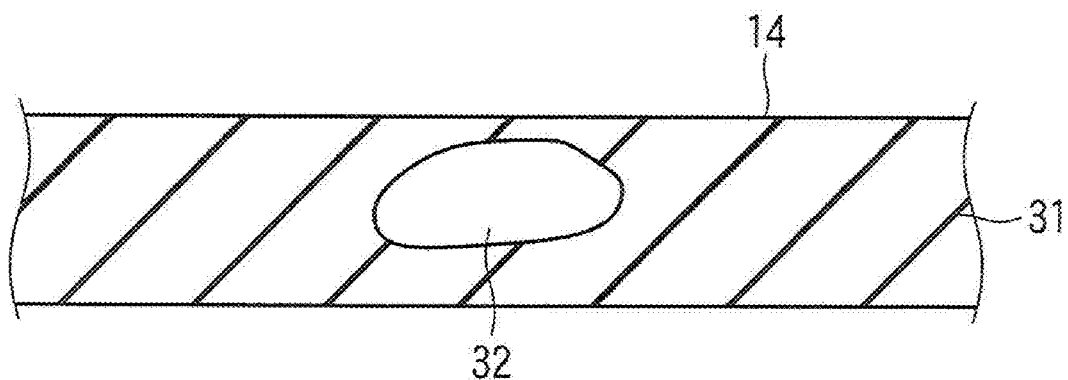
FIG. 5 is a cross-sectional view illustrating a shape of a void included in a single insulating layer.

As shown in FIG. 5, when the insulating base 14 is formed of a single layer 31, the thickness of the layer 31 simply quadruples that of the embodiment of the present invention. With this configuration, when air bubbles are included in glass frit which will be the single layer 31, the air bubbles cannot easily exit from the layer 31 in the process of burning, since the layer 31 itself is thick. On the contrary, the air bubbles expand under the influence of heat generated during burning, and are most likely to remain in the insulating base 14 as large voids 32. Thereby, as shown in FIG. 5, the thickness of the insulating base 14 is locally thin in areas corresponding to the voids 32. This makes it difficult to secure dielectric strength.

Based upon the foregoing, the configuration of the insulating base 14 including the four insulating layers 17a, 17b, 17c and 17d stacked on one another is advantageous in securing dielectric strength, in comparison with the insulating base 14 formed of a single layer 31. Furthermore, the thickness of the four insulating layer 17a, 17b, 17c and 17d can be decreased as much as possible, and the insulating base 14 and the substrate 8 can be made thin.

In addition, if the insulating base 14 is made thin, thermal resistance of the insulating base 14 so as to transfer heat of the light-emitting diode 10 to the base 13 decreases. Accordingly, heat of the light-emitting diode 10 can be effectively transferred from the insulating base 14 to the base 13. Accordingly, heat dissipation properties of the light-emitting diode 10 are improved, and thereby increase in temperature of the light-emitting diode 10 is suppressed, and a sufficient quantity of light can be obtained for illumination purpose.

As described above, by making the insulating base 14 that supports the light-emitting diode 10 as a multi-layered structure, it is possible to assure compatibility between securing dielectric strength between the insulating base 14 and the light-emitting diode 10, and increasing heat dissipation properties of the light-emitting diode 10.

Furthermore, according to the present embodiment, only the fourth insulating layer 17d forming the mount surface 19 is blended with titanium oxide, which is a white pigment used so as to provide the insulating base 14 with light reflectivity. In other words, titanium oxide used so as to increase thermal resistance is not blended into the first to third insulating layers 17a, 17b and 17c. Thereby, increase in thermal resistance can be minimized even though the insulating base 14 is provided with light reflectivity, and satisfactory heat transfer from the light-emitting diode 10 to the heat dissipater 15 of base 13 can be maintained. Accordingly, heat dissipation properties of the light-emitting diode 10 are not lost.

The present inventors conducted a lighting experiment of measuring a dielectric strength characteristic ratio, a heat dissipation characteristic ratio, and a light-emitting amount ratio of Examples 1 and 2: the Example 1 is a light-emitting module 2 corresponding to the above-described embodiment; and the Example 2 is a light-emitting module having the same configuration as the above-described embodiment except that the insulating base 14 does not have light reflectivity.

In this lighting experiment, a light-emitting module was prepared, in which an insulating layer with the thickness of 60 μm is formed using paste-form glass frit blended with 30 wt % of titanium oxide, as Comparative Example 1. Furthermore, a light-emitting module was prepared, in which an insulating layer with the thickness of 80 μm is formed using paste-form glass frit blended with 30 wt % of titanium oxide, as Comparative Example 2.

Table 1 illustrates the result of measurement obtained by the lighting experiment.

TABLE 1

| | Structure of insulating layer | Inclusion of white pigments in insulating layer | Dielectric strength characteristic ratio | Heat dissipation characteristic ratio | Light-emitting amount ratio |
|---|---|---|---|---|---|
| Example 1 | Stacked layer of 60 μm | Included only in fourth layer | 100 | 130 | 100 |
| Example 2 | Stacked layer of 60 μm | No | 100 | 130 | 85 |
| Comparative Example 1 | Stacked layer of 60 μm | Included | 85 | 100 | 100 |
| Comparative Example 2 | Stacked layer of 80 μm | Included | 100 | 100 | 100 |

As shown in Table 1, referring to Comparative Examples 1 and 2, Comparative Example 2, in which the insulating layer is thicker, is superior to Comparative Example 1, with respect to the dielectric strength properties. Assuming that the dielectric strength properties of Comparative Example 2 are 100, the dielectric strength properties are 100 in Examples 1 and 2 too, in which the thickness of the insulating base 14 is smaller than that of Comparative Example 2. It is therefore clear that the dielectric strength can be secured while maintaining the thickness of the insulating base 14 smaller than Comparative Example 2, by providing the insulating base 14 so as to have a multi-layered structure.

Furthermore, as clear from Table 1, with respect to the heat dissipation properties of the light-emitting diode 10 based on heat conductivity from the light-emitting diode 10 to the base 13, Examples 1 and 2 are superior to Comparative Examples 1 and 2.

In addition, as clear from Table 1, in Example 1 and Comparative Examples 1 and 2, in which the insulating base 14 has light reflectivity, the quantity of light (efficiency of obtaining light) of the light-emitting module 2 is equal. Assuming that the quantities of light of Embodiment 1 and Comparison Examples 1 and 2 are 100, the quantity of light of the light-emitting module decreases in Example 2, in which the insulating base does hot have light reflectivity. It was therefore verified that the insulating base 14 should preferably have light reflectivity in order to obtain a sufficient quantity of light for general illumination purpose.

The present invention is not specified to the above-described embodiment, and can be made with various modifications within the scope of the invention.

For example, the number of the insulating layers is not limited to the one described in the above-described embodiment, and may of course be three or more than three, depending on a desired thickness of the insulating base.

What is claimed is:
1. A light-emitting module comprising:
a substrate including a metal base and an insulating base that is stacked on the metal base and has a mount surface on a side opposite to the metal base, the insulating base of the substrate including a plurality of insulating layers stacked on one another along a thickness direction of the substrate, the insulating layers having a same thickness, wherein a material that increases light reflectivity and thermal resistance is blended only into a single insulating layer forming the mounting surface of the insulating base;

a wiring pattern provided on the mount surface of the substrate; and a light-emitting device mounted on the mount surface of the substrate, the light-emitting device being electrically connected to the wiring pattern, and being configured to generate heat upon energization.

2. The light-emitting module according to claim 1, wherein each of the insulating layers includes a void, and the size of the void is smaller than a thickness of each of the insulating layers.

3. The light-emitting module according to claim 1, wherein the metal base has a heat dissipater configured to dissipate heat of the light-emitting device, and the heat dissipater is located on a side opposite to the insulating base.

4. An illuminating apparatus comprising:

a light-emitting module; and a lighting apparatus configured to light the light-emitting module, wherein the light-emitting module includes:

a substrate including a metal base and an insulating base that is stacked on the metal base and has a mount surface on a side opposite to the metal base, the insulating base of the substrate including a plurality of insulating layers stacked on one each another along a thickness direction of the substrate, the insulating layers having a same thickness, wherein a material that increases light reflectivity and thermal resistance is blended only into a single insulating layer forming the mounting surface of the insulating base;

a wiring pattern provided on the mount surface of the substrate; and a light-emitting device mounted on the mount surface of the substrate, the light-emitting device being electrically connected to the wiring pattern, and being configured to generate heat upon energization.

5. An illuminating apparatus according to claim 4, wherein the metal base has a heat dissipater configured to dissipate heat of the light-emitting device, and the heat dissipater is located on a side opposite to the insulating base.

* * * * *